(12) United States Patent
Cockburn et al.

(10) Patent No.: US 7,233,265 B2
(45) Date of Patent: Jun. 19, 2007

(54) METHOD AND ARRANGEMENT FOR DATA COMPRESSION ACCORDING TO THE LZ77 ALGORITHM

(75) Inventors: Gordon Cockburn, Hampshire (GB); Adrian John Hawes, Hampshire (GB)

(73) Assignee: International Business Machines Corporation, Armonk, NY (US)

( * ) Notice: Subject to any disclaimer, the term of this patent is extended or adjusted under 35 U.S.C. 154(b) by 415 days.

(21) Appl. No.: 10/513,263

(22) PCT Filed: Jan. 30, 2003

(86) PCT No.: PCT/GB03/00384

§ 371 (c)(1),
(2), (4) Date: Nov. 1, 2004

(87) PCT Pub. No.: WO03/096543

PCT Pub. Date: Nov. 20, 2003

(65) Prior Publication Data

US 2005/0179569 A1 Aug. 18, 2005

(30) Foreign Application Priority Data

May 9, 2002 (GB) .................................. 0210604.5

(51) Int. Cl.
*H03M 7/34* (2006.01)

(52) U.S. Cl. ........................... 341/51; 341/106; 341/87

(58) Field of Classification Search .................. 341/50, 341/51, 106, 87
See application file for complete search history.

(56) References Cited

U.S. PATENT DOCUMENTS 5,179,378 A    1/1993  Ranganathan et al. ........ 341/51

(Continued)

FOREIGN PATENT DOCUMENTS

EP    1 148 649 A1    10/2001
WO    WO-03/096544 A1    11/2003

OTHER PUBLICATIONS

Chun-Te Chen et al., "High-Speed VLSI Design Of The LZ-Based Data Compression", 1997 IEEE International Symposium on Circuits and Systems, Jun. 9-12, 1997, Hong Kong, pp. 2064-2067.
Bongjin Jung et al., "Efficient VLSI for Lempel-Ziv Compression in Wireless Data Communications Networks", IEEE Transactions on Very Large Scale Integration (VLSI) Systems, vol. 6, No. 3, Sep. 1998, pp. 475-483.

*Primary Examiner*—Linh Nguyen
(74) *Attorney, Agent, or Firm*—Harrington & Smith, PC

(57) ABSTRACT

A method (300) and arrangement for LZ1 compression of a data string where multiple input symbols are compared in parallel with the history buffer by: holding in an input buffer (140) a first sequence of bytes of the data string; holding in a history buffer (110, 120) a second sequence of bytes of the data string; comparing (170), in matrix comparison means coupled to the input buffer and the history buffer and having a plurality of rows and columns of comparison units (200), bytes held in the input buffer with bytes held in the history buffer, bytes of the history buffer being coupled to diagonally displaced comparison units in the matrix comparison means; detecting (150) in each of the rows the column in which a largest number of consecutive byte matches has occurred at the comparison unit in that row and preceding comparison units in the same column; and encoding (160) as a token a sequence of matched bytes detected in the step of detecting (150).

33 Claims, 4 Drawing Sheets

U.S. PATENT DOCUMENTS

| | | | |
|---|---|---|---|
| 5,506,580 A * | 4/1996 | Whiting et al. | 341/51 |
| 5,608,396 A * | 3/1997 | Cheng et al. | 341/50 |
| 5,771,010 A * | 6/1998 | Masenas | 341/51 |
| 5,771,011 A | 6/1998 | Masenas | 341/51 |
| 5,805,086 A * | 9/1998 | Brown et al. | 341/51 |
| 5,874,908 A * | 2/1999 | Craft | 341/87 |
| 5,903,230 A * | 5/1999 | Masenas | 341/51 |
| 5,936,560 A * | 8/1999 | Higuchi | 341/106 |
| 6,657,565 B2 * | 12/2003 | Kampf | 341/51 |
| 6,693,567 B2 * | 2/2004 | Cockburn et al. | 341/51 |
| 6,885,319 B2 * | 4/2005 | Geiger et al. | 341/51 |

* cited by examiner

METHOD AND ARRANGEMENT FOR DATA COMPRESSION ACCORDING TO THE LZ77 ALGORITHM

FIELD OF THE INVENTION

This invention relates to data compression, and particularly to 'LZ1' data compression.

BACKGROUND OF THE INVENTION

The Lempel-Ziv algorithms are well known in the field of data compression. In particular, the "history buffer" version, known as LZ1, has become particularly popular in hardware implementations wherever lossless compression of coded data is required, since its relatively modest buffer requirements and predictable performance make it a good fit for most technologies.

The LZ1 algorithm works by examining the input string of characters and keeping a record of the characters it has seen. Then, when a string appears that has occurred before in recent history, it is replaced in the output string by a "token": a code indicating where in the past the string has occurred and for how long. Both the compressor and decompressor must use a "history buffer" of a defined length, but otherwise no more information need be passed between them.

Characters that have not been seen before in a worthwhile string are coded as a "literal". This amounts to an expansion of the number of bits required, but in most types of data the opportunities for token substitution (and hence compression) outweigh the incompressible data, so overall compression is achieved. Typical compression ratios range from 2:1 to around 10:1.

Some variations of the basic LZ1 algorithm have emerged over the years, but improvements have been incremental.

As the LZ1 algorithm works on units of a byte, traditional hardware implementations consider just one byte at a time when compressing the input stream. As each byte is input, the "history buffer" is scanned—using, for example, a Content-Addressable-Memory (CAM)—for all occurrences of the byte. As a single byte is not considered an efficient candidate for string replacement, any matches found must be supplemented by consecutive matches before token substitution takes place.

Each subsequent byte that is input is also sought in the history buffer, but the only matches reported are those following existing matches. Finally, the string match may terminate (when no more matches found that adjoin known matches) and the surviving "string match" is coded for substitution. The longer the match, the greater the saving in bits.

A simple implementation of the LZ1 algorithm which processes one byte per clock cycle is limited to some 100–200 MB/s at typical clock rates for current ASIC (application specific integrated circuit) technology. However, this may be insufficient for some applications (such as, for example, memory compression, optical networks and RAID disk arrays) which require high bandwidth for a single data stream. To increase performance, that is, the number of bytes that may be compressed per second, either the "cycle time" (the time taken to input the byte and find all matches) must be reduced, or the CAM be modified to search for more than one byte at a time. Because of the difficulty of designing multiple-input CAMS, performance improvements have usually concentrated on shortening the access time of the CAM, and hence the cycle time. But of course, the two improvements are not mutually exclusive; a multi-byte CAM will gain performance over and above any reduction in cycle time.

A previous attempt at more than one byte per cycle compression may be found in U.S. Pat. Nos. 5,771,011 and 5,929,791 (the latter being a divisional of the former), which match two bytes per cycle. Although these patents purport to indicate the steps necessary to extend their technique to more than two bytes, their teaching is incomplete and unrealisable as to how this is to be done: although they give a formula for the number of equations required in their technique for N bytes per cycle compression, they do not indicate how the equations themselves are to be derived. Nor do they reveal how a 'circular buffer' that is used can be adapted to handle larger numbers of input bytes per cycle.

An earlier U.S. Pat. No. 5,179,378 uses a different technique for comparing an input byte with a history buffer. Rather than inputting one byte at a time and employing a full parallel comparison (comparing that byte with the entire contents of the history buffer) each clock cycle, as in the above prior art patents, U.S. Pat. No. 5,179,378 breaks the comparison down into stages using 'systolic array' pipelining. However, the technique of this patent does not achieve a processing rate of more than one input byte per cycle, and may not even complete processing of one byte per cycle.

A need therefore exists for a method and arrangement for data compression wherein the above-mentioned disadvantage(s) may be alleviated.

STATEMENT OF INVENTION

In accordance with a first aspect of the present invention there is provided an arrangement for LZ1 compression of a data string that includes input buffer means for holding a first sequence of bytes of the data string; history buffer means for holding a second sequence of bytes of the data string; matrix comparison means coupled to the input buffer means and the history buffer means and having a plurality of rows and columns of comparison units for comparing bytes held in the input buffer means with bytes held in the history buffer means, bytes of the history buffer means being coupled to diagonally displaced comparison units in the matrix comparison means; detecting means for detecting in each of the rows the column in which a largest number of consecutive byte matches has occurred at the comparison unit in that row and preceding comparison units in the same column; and means for encoding as a token a sequence of matched bytes detected by the detecting means.

In accordance with a second aspect of the present invention there is provided a method for LZ1 compression of a data string that includes holding in an input buffer a first sequence of byes of the data string; holding in a history buffer a second sequence of bytes of the data string; comparing, in matrix comparison means coupled to the input buffer and the history buffer and having a plurality of rows and columns of comparison units, bytes held in the input buffer with bytes held in the history buffer, bytes of the history buffer being coupled to diagonally displaced comparison units in the matrix comparison means: detecting in each of the rows the column in which a largest number of consecutive byte matches has occurred at the comparison unit in that row and preceding comparison units in the same column; and encoding as a token a sequence of matched bytes detected in the step of detecting.

BRIEF DESCRIPTION OF THE DRAWINGS

One method and arrangement for data compression incorporating the present invention will now be described, by way of example only, with reference to the accompanying drawing(s), in which.

DESCRIPTION OF PREFERRED EMBODIMENT(S)

The following preferred embodiment is described in the context of an LZ1 variant attributed to IBM and known as "IBMLZ1", but it will be understood that the technique presented is applicable to all versions of the LZ1 algorithm. This technique is expandable to any number of bytes per cycle, or any length of history buffer, but it will be described using a 12-byte-per-cycle design with a 512-byte history buffer.

Figure 1:
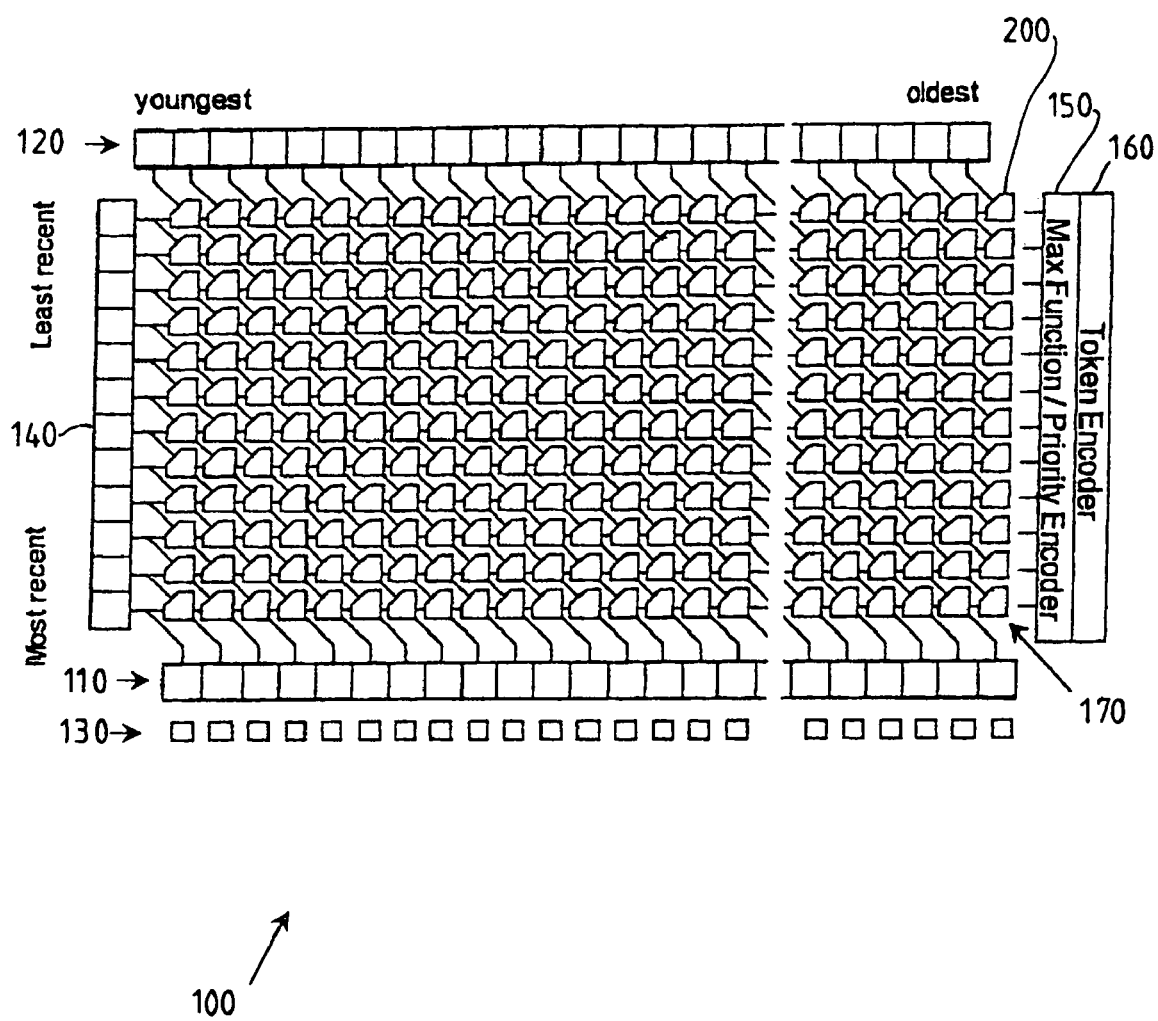
FIG. 1 shows a block schematic diagram of a comparison matrix used in a compression arrangement utilising the present invention.

Referring now to FIG. 1, a compression arrangement 100 includes two groups (L1 and L2) of 512-byte latches 110 and 120, a group of 512 carry latches 130, a 12-byte input buffer 140, a MAX Function/Priority Encoder 150, a token encoder 160, and a 512-by-12 matrix array 170 of comparison units 200 (which will be described in greater detail below).

The L2 latches 120 are coupled respectively to 512 comparison units in the first row of the matrix 170, and to comparison units diagonally displaced successively by one unit to the right in each lower row of the matrix as will be explained in more detail below. The L1 latches 110 and associated carry latches 130 are coupled respectively to the 512 comparison units in the last row of the matrix 170. The 12 bytes of the input buffer 140 are coupled respectively to the 12 rows of comparison units in the leftmost column of the matrix 170. The MAX Function/Priority Encoder 150 and token encoder 160 are coupled to the 12 rows of comparison units in the matrix 170.

The 12 input bytes have to be compared with the entire history buffer, in the search for matches. However, some of the input bytes themselves constitute part of the "history". A 12-byte input buffer must assume that each byte is in chronological order, even though they all enter in one cycle. Therefore one end of the input buffer is considered "most recent", and the other "least recent", as if the "least recent" bytes entered the process first. Each byte must consider those in the input buffer that are "less recent" to be part of the history, and be compared accordingly.

The manner in which the input bytes are compared, both with the bytes in the history buffer and the less recent bytes in the input buffer, is shown in FIG. 1. Considering the input buffer 140 on the left of the diagram, if the processing were the conventional type—one byte at a time—then the top byte would be the first in and the bottom byte the last; however, in this implementation the bytes are all input at the same time. As can be seen, the outputs of the input buffer—all 12 input bytes—are connected to the inputs of all comparison units 200 in each row of the matrix 170. In each clock cycle the contents of the history buffer—all 512 bytes of it—are fed down for comparison with the first (least recent) byte of the input buffer, and then diagonally down and across for comparison with the most recent byte of the input buffer.

It will be understood that, as every byte of the history buffer must be available at once, conventional RAM cannot be used for the history buffer. In this implementation the history buffer is constructed using registers, arranged as level sensitive scan design (LSSD) L1–L2 pairs. At the end of each clock cycle the 12 input bytes are shifted into the history buffer, the old contents of the history buffer are shifted along (to the right as shown in FIG. 1) by 12 bytes, and the oldest 12 bytes are discarded.

Figure 2:
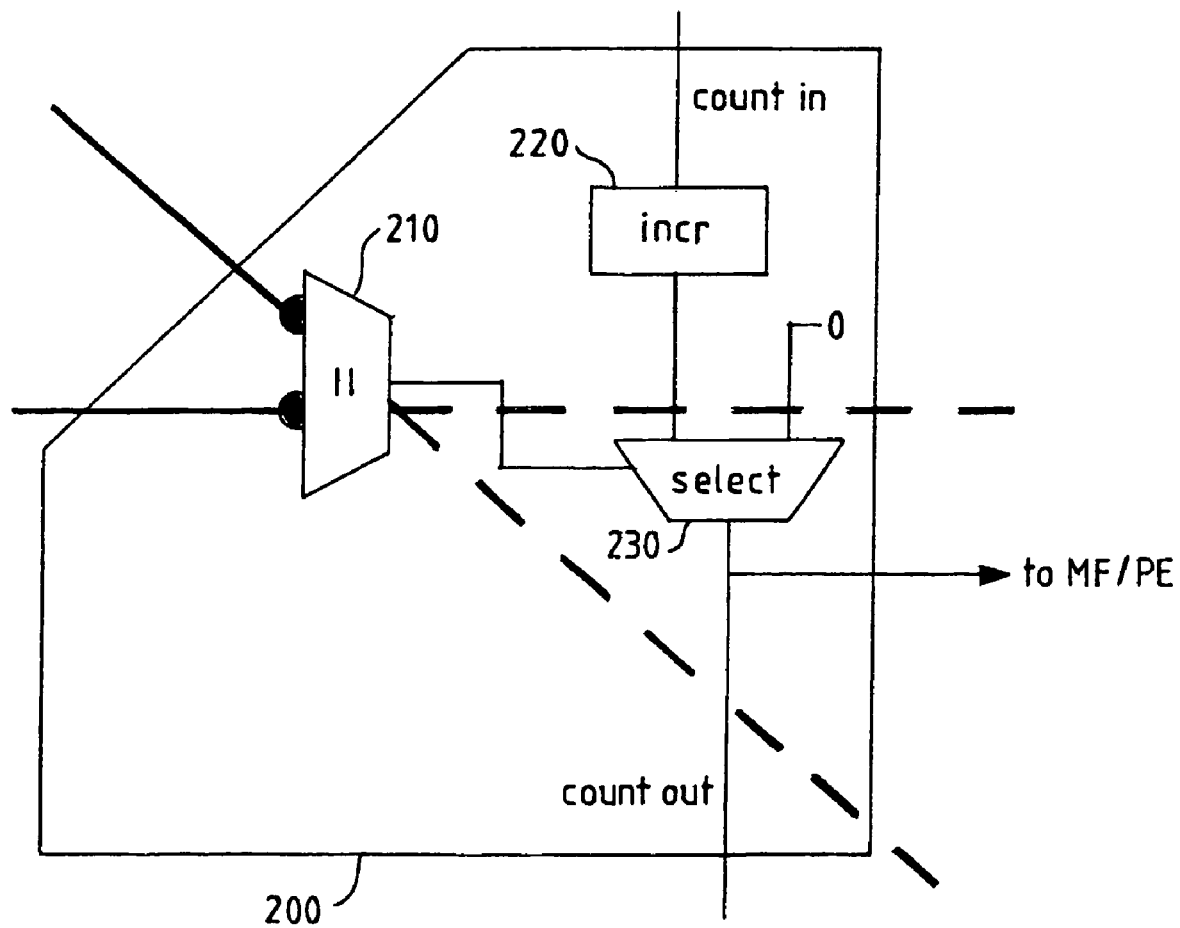
FIG. 2 shows a block schematic diagram illustrating in detail a comparison unit of the compression arrangement of FIG. 1.

The comparison units 200, represented by clipped squares in FIG. 1, are a fundamental element of this design. An expanded diagram of a comparison unit is shown in FIG. 2. It is the job of each block to compare the values of the two input bytes, tally up the count of matched bytes, and report a winning match to control logic.

A comparison unit 200 in the matrix 170 includes a byte comparator 210 arranged to receive for comparison a byte value from the input buffer byte position for that row and a history buffer byte value passed from a unit diagonally left and above. An incrementer 220 is arranged to receive and increment by '1' a 'count in' value from a unit directly above in the same column of the matrix. A selector 230 is arranged to receive the incremented count value and a '0' value and to select between these in dependence on the output of the comparator 210. If the comparator 210 indicates a match, the selector 230 outputs the incremented count value; otherwise it outputs a '0' value. The output of the selector is passed as a 'count out' value to a unit directly below in the same column; the selector output is also passed to MFPE for the same row of the matrix. As shown by the thick dashed lines, the byte values input to the selector 210 are passed to a unit directly to the right in the same row and to a unit diagonally below and right.

FIG. 2 shows that in addition to the byte to be compared, the unit 200 takes as input the "count" from the unit above, which indicates the length of the string seen thus far, and the byte for the same row of the input buffer 140. If the two input bytes match, then the comparison unit will increment that count, and pass the new count to the unit below it. If the two bytes do not match then the output count will be set to zero, regardless of the input count value.

The value of this count is also output from the right-hand side of each comparison unit, and is fed to the "MAX Function/Priority Encoder" (MFPE) logic 150 at the end of the row. There is one of these MFPE units for each of the twelve rows of the compressor 100. The function of the MFPE is to decide which comparison unit(s) 200 of the 512 in that row reported the longest string (i.e., the largest count—the MAX function), and to encode the position within the row. If more than one column produces the same large count then the MFPE encodes (arbitrarily) the leftmost value (the priority encoding function). However, it may be noted that the value produced by the MFPE is not necessarily the string that will be encoded, as the string may continue beyond that row.

String matches that are still alive in row 12 (the last row of the matrix 170) may continue into the next cycle. The carry latches 130 at the bottom of FIG. 1 store the position of any surviving strings from this row. (The length of that string—the "count"—is stored in a separate single register, not shown.) The carry is fed into the "count input" to the first row of comparison units in the next cycle. It may be noted that there is a limit to the string length that can be encoded by the LZ1 algorithm, imposed by the number of bits in the token. (In IBMLZ1 the limit is 271 characters.) When the maximum number is reached a token is emitted and the string must start from zero. It will be appreciated that the token encoder 160 operates in the same manner known in the prior art and its structure and function need not be described in any further detail.

The largest string values for each row (reported by the MFPE 150) and their encoded positions are fed to the Token Encoder (TE) 160. The TE examines the reported lengths for each row, and decides where strings can be encoded for this batch of 12 input bytes. Where strings are to be encoded, the TE uses the positions reported by the MFPE as part of the token, along with the string length. Note that the length may rise to more than 12, when a long string spans more than one cycle. When this happens, the count is accumulated in the TE, ready for coding when the string terminates.

If no strings are found (noting that a match of just one byte is not worth encoding) or if some of the 12 bytes cannot be matched, then the TE must output literals. For this the TE takes data directly from the input buffer 140.

Figure 3:
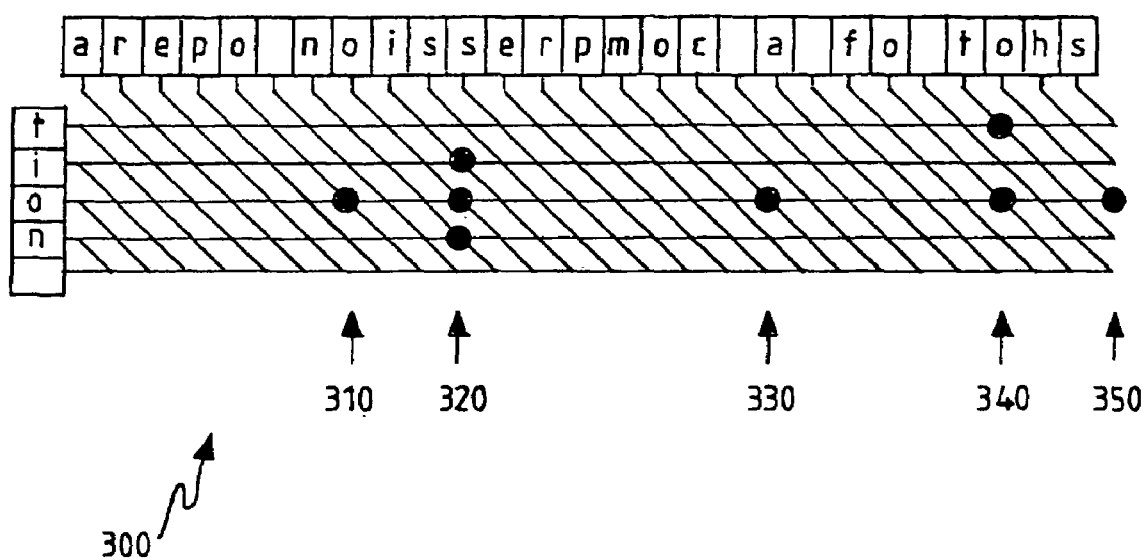
FIG. 3 shows a schematic diagram illustrating compression operation in the compression arrangement of FIG. 1.

FIG. 3 shows a snapshot of a compression operation 300. The previous sentence is used as input, and for simplicity only 5 input bytes and 27 history buffer bytes are shown. The filled circles (at columns 310, 320, 330, 340 and 350) indicate where a match is detected; a useful string match can be seen at column 320 in the current input bytes "ion". It is the position of column 320 in the row that will be forwarded for encoding.

Figure 4:
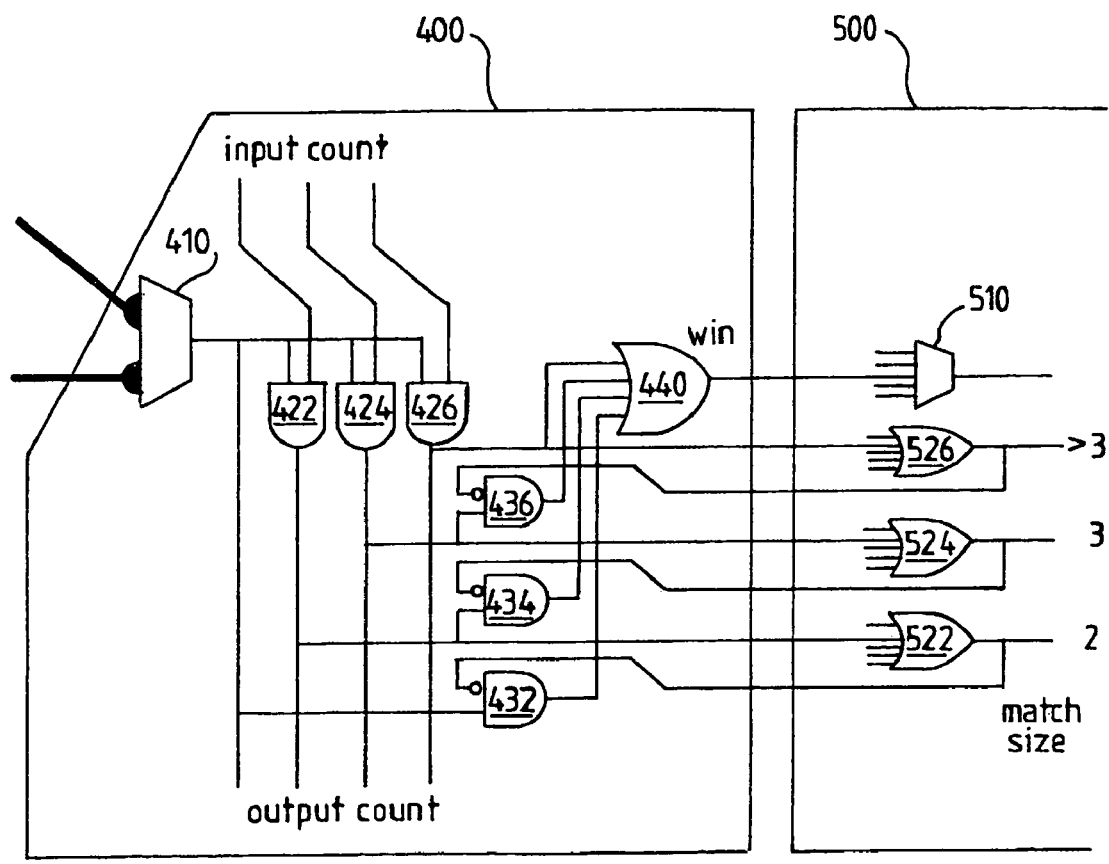
FIG. 4 shows a block schematic diagram illustrating in detail a particular implementation of a comparison unit matrix used in the compression arrangement of FIG. 1.

A possible implementation 400 for the comparison unit is shown in FIG. 4. The comparison unit 400 (which as illustrated is a unit of row 3 of the matrix 170) has a comparator 410 which receives the two byte values to be compared as described above. Three AND gates 422, 424 and 426 each have one of their inputs connected to receive the output of the comparator 410, and have their other inputs connected to receive respective ones of three bit lines (carrying a 3-bit 'input count' value) from a comparison unit directly above in the same column. The outputs of the AND gates 422, 424 and 426, together with the output of the comparator 410, (carrying a 4-bit 'output count' value) are connected to a comparison unit directly below in the same column. The leftmost three of the 'output count' bit lines are connected respectively to inputs of three AND gates 432, 434 and 436. The outputs of the AND gates 432, 434 and 436, together with the output of the AND gate 426, are connected to inputs of a 4-input OR gate 440.

The output of the OR gate 440 (together with outputs of the other comparison units 400 in row 3 of the matrix 170) are connected, within an MFPE 500, to inputs of a 512-input priority encoder 510. Also within the MFPE 500, the outputs of the AND gates 422, 424 and 426 are connected (together with outputs of AND gates of other comparison units 400 in row 3 of the matrix 170) to respective inputs of 512-input OR gates 522, 524 and 526, the outputs of the OR gates 522, 524 and 526 are connected invertedly to inputs of the AND gates 432, 434 and 436 in each of the comparison units 400 in row 3 of the matrix 170.

The comparator 410 is the same as the comparator 210 in the comparison unit 200 described above, but in the comparison unit 400 the "count" is maintained by an N-bit vector. The bits of this vector are numbered 1 to N, and a count of "n" is represented by bits 1 to n being '1'. All other bits in the vector are '0'. Thus, a count of zero is shown by all bits being zero. This is a useful method of counting in this design because:

1. The number of bits required, N, need only be as large as the row number (row 1 needs only 1 bit, row 12 needs 12 bits),
2. The "count" is easily incremented, merely shifting to the right with a '1' fill, and
3. A MAX function is easily implemented, by ORing the respective bits of all the vectors together.

With a small amount of extra logic (in the form of the AND gates 432, 434 and 436 and the OR gate 440) in the comparison unit, the priority encoder is made simple also.

In operation of the comparison unit 400 of FIG. 4, this works as follows. The input count is represented by a 3-bit vector, which can indicate 4 values:

| Vector | Indicated Value | Indicated Match |
|--------|-----------------|-----------------|
| 000 | zero | |
| 100 | one | match in this column in row 2 |
| 110 | two | match in this column in rows 1 and 2 |
| 111 | more than two | match in this column in rows 1 and 2, and a carry |

If the comparator 410 detects a match in this column in this row (row 3), it will increment the count, producing a 4-bit vector 'output count' from the bottom of the unit. The incrementation will be achieved by effectively shifting the input vector right by one bit, adding a '1' at the left. If there is no match here, the AND gates 422, 424 and 426 are all turned off and the 'output count' collapses to zero.

A modified version of the 4-bit count is output to logic circuitry 510, 522, 524 and 526 in the MFPE 500 at the end of the row, also shown in FIG. 4. The three 512-input OR gates 522, 524 and 526 decide the maximum count for this row (the low-order bit is not used as it represents a count of only 1 byte). This maximum value is used to disqualify all counts smaller than the winning count, by means of AND gates 432, 434 and 436 in the comparison units 400 of the columns that do not contribute this maximum count. Those comparison units that show the maximum counts declare their candidacy on the encoder input, and the priority encoder codes the position of the leftmost of them. The "win" outputs of OR gates 440 in the comparison units of the bottom row comprise the 512 "carry" bits to be stored for the next cycle.

Although the above description has shown all operations happening in a single cycle, the design does not preclude some elements of pipelining. The critical factor is that the carry for each row must be successfully stored in one cycle, ready for inclusion in the next cycle's calculations.

The critical timing path—producing a valid carry for the next cycle—consists in this case of up to 12 AND gates (from a string of 12 matches), through a 512-input OR gate (which probably has several cascaded gates) and then through two more AND gates for the carry.

Thus, a total of some 20 gate delays determines the maximum operating frequency for this design. The 12 AND gate delays may be reduced by using look-ahead techniques, although this adds to the gate count.

It can be understood that comparison units 400 in the lower rows of the matrix 170 have proportionally more gates, and so it can be understood that the total number of gates increases with the square of the number of bytes processed per cycle.

It will be also be appreciated that the arrangement and method described above for will typically be carried out in hardware, for example in the form of an integrated circuit (not shown) such as an ASIC (Application Specific Integrated Circuit).

In conclusion, it will be understood that the above description has shown how an LZ1 compressor may be constructed that can process an arbitrary number of bytes per cycle, limited by gate count and timing considerations.

It will be understood that the data compression technique described above may be used in a wide range of storage and communication applications.

It will be understood that the data compression technique described above has the advantage that it is expandable to any number of bytes per cycle, or any length of history buffer, and so can provide operation at any desired bandwidth (limited only by gate count and timing considerations as noted above).

It will be understood that other alternatives to the embodiments of the invention described above will be apparent to a person of ordinary skill in the art.

The invention claimed is:

1. A circuit for compressing a data string, comprising:
  an input buffer for holding a first sequence of bytes of the data string;
  a history buffer for holding a second sequence of bytes of the data string;
  a matrix comparator coupled to the input buffer and the history buffer and having a plurality of rows and columns of comparison units for comparing bytes held in the input buffer with bytes held in the history buffer, bytes of the history buffer being coupled to diagonally displaced comparison units in the matrix comparison;
  a detector for detecting in each of the rows the column in which a largest number of consecutive byte matches has occurred at the comparison unit in that row and preceding comparison units in the same column; and
  an encoder for encoding as a token a sequence of matched bytes detected by the detector.

2. The circuit of claim 1 wherein:
  the matrix comparator comprises a counter for producing at each comparison unit a count of the number of consecutive byte matches occurring at said comparison unit and preceding comparison units in the same column; and
  the detector operates for detecting in each row a column at which a maximum count occurs.

3. The circuit of claim 2 wherein each comparison unit comprises:
  a comparator for comparing bytes from the input buffer and the history buffer;
  an incrementor for receiving and incrementing a count value from another comparison unit in the same column; and
  a selector for receiving the output of the comparator and in dependence thereon selecting the output of the incrementor or a zero value for passing to another comparison unit in the same column.

4. The circuit of claim 2 wherein each comparison unit comprises:
  a comparator for comparing bytes from the input buffer and the history buffer; and
  first logic for receiving a value having a number of bits representative of a count value from another comparison unit in the same column, and for receiving the output of the comparator and in dependence thereon zeroing the value or incrementing the value by shifting and adding a further bit to the value.

5. The circuit of claim 4 wherein the detector comprises second logic for receiving as inputs the bits of the value and for performing a logical OR operation thereon to produce a maximum of the value.

6. The circuit of claim 1 wherein the history buffer comprises:
  a first shift register coupled to comparison units in a row at a first side of the matrix comparator, and
  a second shift register coupled to comparison units in a row at a second side of the matrix comparator opposite the first side.

7. The circuit of claim 6 wherein the first shift register and the second shift register comprise level sensitive scan design (LSSD) pairs in the same shift register.

8. The circuit of claim 1 wherein the first sequence of bytes and the second sequence of bytes are consecutive within the data string.

9. The circuit of an claim 1 further comprising carry logic for storing column carry information from comparisons with a first configuration of data in the input buffer and the history buffer for use in comparisons with a second configuration of data in the input buffer and the history buffer.

10. A method to compress a data string, comprising:
  holding in an input buffer a first sequence of bytes of the data string;
  holding in a history buffer a second sequence of bytes of the data string;
  comparing with a matrix comparator that is coupled to the input buffer and the history buffer, and that comprises a plurality of rows and columns of comparison units, bytes held in the input buffer with bytes held in the history buffer, bytes of the history buffer being coupled to diagonally displaced comparison units in the matrix comparator;
  detecting in each of the rows the column in which a largest number of consecutive byte matches has occurred at the comparison unit in that row and preceding comparison units in the same column; and
  in response to detecting, encoding as a token a sequence of matched bytes.

11. The method of claim 10 wherein:
  comparing comprises producing at each comparison unit a count of the number of consecutive byte matches occurring at said comparison unit and preceding comparison units in the same column; and
  detecting comprises detecting in each row a column at which a maximum count occurs.

12. The method of claim 11 wherein comparing comprises, at each comparison unit:
  comparing bytes from the input buffer and the history buffer;
  incrementing a count value received from another comparison unit in the same column; and
  selecting, in dependence on the result of comparing bytes from the input buffer and the history buffer, the incremented count value or a zero value for passing to another comparison unit in the same column.

13. The method of claim 11 wherein comparing comprises, at each comparison unit:
  comparing bytes from the input buffer and the history buffer;
  receiving a value having a number of bits representative of a count value from another comparison unit in the same column, and in dependence on a result of comparing bytes from the input buffer and the history buffer, zeroing the value or incrementing the value.

14. The method of claim 13 wherein detecting comprises receiving the bits of the value and performing a logical OR operation thereon to produce a maximum of the value.

15. The method of any claim 10, wherein the history buffer comprises:
a first shift register coupled to comparison units in a row at a first side of the matrix comparator, and
a second shift register coupled to comparison units in a row at a second side of the matrix comparator opposite the first side.

16. The method of claim 15 wherein the first shift register and the second shift register comprise level sensitive scan design (LSSD) pairs in the same shift register.

17. The method of claim 10 wherein the first sequence of bytes and the second sequence of bytes are consecutive within the data string.

18. The method of claim 10, further comprising storing column carry information from comparisons with a first configuration of data in the input buffer and the history buffer for use in comparisons with a second configuration of data in the input buffer and the history buffer.

19. An integrated circuit comprising the circuitry of claim 1.

20. The integrated circuit of claim 19 wherein the integrated circuit comprises an application specific integrated circuit (ASIC).

21. A signal bearing medium tangibly embodying a program of machine-readable instructions executable by a digital processing apparatus to perform operations to compress a data string, the operations comprising:
storing in a first buffer a first sequence of bytes of the data string;
storing in a second buffer a second sequence of bytes of the data string;
comparing bytes stored in the first buffer with bytes stored in the second buffer using a matrix comparison operation that embodies an array of individual comparison units arranged in rows and columns of comparison units, where bytes of the second buffer are coupled to diagonally displaced comparison units in the array;
detecting, in each of the rows, a column in which a largest number of consecutive byte matches has occurred at the comparison unit in that row and preceding comparison units in the same column; and
responsive to detecting, encoding as a token a sequence of matched bytes.

22. The signal bearing medium of claim 21, where the operation of comparing generates at each comparison unit a count of the number of consecutive byte matches occurring at said comparison unit and preceding comparison units in the same column; and where the operation of detecting comprises detecting in each row a column at which a maximum count occurs.

23. The signal bearing medium of claim 22, where the operation of comparing comprises, at each comparison unit, comparing bytes from the first buffer and the second buffer; incrementing a count value received from another comparison unit in the same column; and selecting, responsive to a result of comparing bytes from the first buffer and the second buffer, the incremented count value or a zero value for passing to another comparison unit in the same column.

24. The signal bearing medium of claim 22, where the operation of comparing comprises, at each comparison unit, comparing bytes from the input buffer and the history buffer; receiving a value having a number of bits representative of a count value from another comparison unit in the same column, and responsive to a result of comparing bytes from the first buffer and the second buffer, one of zeroing the value or incrementing the value.

25. The signal bearing medium of claim 24, where the operation of detecting comprises receiving the bits of the value and performing a logical OR operation thereon to produce a maximum of the value.

26. The signal bearing medium of claim 21, where the second buffer comprises a first shift register coupled to comparison units in a row at a first side of the array and a second shift register coupled to comparison units in a row at a second side of the array opposite the first side.

27. The signal bearing medium of claim 21, where the first sequence of bytes and the second sequence of bytes are consecutive within the data string.

28. The signal bearing medium of claim 21, further comprising an operation of storing column carry information from comparisons with a first configuration of data in the first buffer and the second buffer for use in comparisons with a second configuration of data in the first buffer and the second buffer.

29. The signal bearing medium of claim 21, where the second buffer operates as a history buffer, and where the compression implements a Lempel-Ziv algorithm LZ1.

30. The circuit of claim 1, where the compression implements a Lempel-Ziv algorithm LZ1.

31. The method of claim 10, where the compression implements a Lempel-Ziv algorithm LZ1.

32. A circuit for performing LZ1 compression of a data string, comprising: input buffer means for storing a first sequence of bytes of the data string; history buffer means for storing a second sequence of bytes of the data string; matrix comparison means coupled to the input buffer means and to the history buffer means and having a plurality of rows and columns of comparison units for comparing bytes held in the input buffer means with bytes held in the history buffer means, bytes of the history buffer means being coupled to diagonally displaced comparison units in the matrix comparison means; means for detecting in each of the rows the column in which a largest number of consecutive byte matches has occurred at the comparison unit in that row and preceding comparison units in the same column; and means for encoding as a token a sequence of matched bytes detected by the detecting means.

33. The circuit of claim 32, where the matrix comparison means comprises count means for producing at each comparison unit a count of the number of consecutive byte matches occurring at said comparison unit and preceding comparison units in the same column; and the detecting means detects, in each row, a column at which a maximum count occurs.

* * * * *